US012610807B2

(12) United States Patent
Yun et al.

(10) Patent No.: US 12,610,807 B2
(45) Date of Patent: Apr. 21, 2026

(54) INTEGRATED CIRCUIT DEVICES INCLUDING A BACK SIDE POWER DISTRIBUTION NETWORK STRUCTURE AND METHODS OF FORMING THE SAME

(71) Applicant: Samsung Electronics Co., Ltd., Suwon-si (KR)

(72) Inventors: Seungchan Yun, Waterford, NY (US); Wonhyuk Hong, Clifton Park, NY (US); Jaejik Baek, Watervliet, NY (US); Eun Sung Kim, Clifton Park, NY (US); Kang-Ill Seo, Springfield, VA (US)

(73) Assignee: Samsung Electronics Co., Ltd. (KR)

( * ) Notice: Subject to any disclaimer, the term of this patent is extended or adjusted under 35 U.S.C. 154(b) by 558 days.

(21) Appl. No.: 18/147,739

(22) Filed: Dec. 29, 2022

(65) Prior Publication Data

US 2024/0063122 A1 Feb. 22, 2024

Related U.S. Application Data

(60) Provisional application No. 63/371,928, filed on Aug. 19, 2022.

(51) Int. Cl.
    *H01L 23/528* (2006.01)
    *H01L 27/092* (2006.01)
    (Continued)

(52) U.S. Cl.
    CPC ....... *H01L 23/5286* (2013.01); *H10D 30/014* (2025.01); *H10D 30/43* (2025.01); *H10D 30/6729* (2025.01); *H10D 30/6735* (2025.01);
    *H10D 62/121* (2025.01); *H10D 64/01* (2025.01); *H10D 84/856* (2025.01)

(58) Field of Classification Search
    CPC ........... H01L 23/5286; H01L 21/76895; H01L 23/5283; H10D 30/014; H10D 30/43; H10D 30/6729; H10D 30/6735; H10D 62/121; H10D 64/01; H10D 84/856; H10D 30/0198; H10D 30/6757; H10D 64/251; H10D 84/0149; H10D 84/038; H10D 88/00; H10D 84/0133; H10D 88/01; H10D 84/0128;
    (Continued)

(56) References Cited

U.S. PATENT DOCUMENTS

| | | | |
|---|---|---|---|
| 11,355,601 | B2 | 6/2022 | Chiang et al. |
| 2020/0266169 | A1 | 8/2020 | Kang et al. |

(Continued)

OTHER PUBLICATIONS

"Extended European Search Report dated Nov. 29, 2023, issued in corresponding European Application No. 23189410.6, 9 pages".

*Primary Examiner* — Tong-Ho Kim

(74) *Attorney, Agent, or Firm* — Myers Bigel, P.A.

(57) ABSTRACT

Integrated circuit devices and methods of forming the same are provided. The integrated circuit devices may include a transistor including a channel region and a source/drain region contacting the channel region, a power rail that is configured be electrically connected to a power source and is spaced apart from the source/drain region in a first direction, and a power contact that is between the source/drain region and the power rail and contacts both the source/drain region and the power rail. The channel region may overlap the power contact in the first direction.

13 Claims, 14 Drawing Sheets

(51) Int. Cl.

| | |
|---|---|
| *H01L 29/06* | (2006.01) |
| *H01L 29/40* | (2006.01) |
| *H01L 29/417* | (2006.01) |
| *H01L 29/423* | (2006.01) |
| *H01L 29/66* | (2006.01) |
| *H01L 29/775* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/85* | (2025.01) |

(58) Field of Classification Search
CPC . H10D 84/0167; H10D 84/0186; B82Y 10/00
USPC ......................................................... 257/347
See application file for complete search history.

(56) References Cited

U.S. PATENT DOCUMENTS

| | | | | |
|---|---|---|---|---|
| 2021/0408249 | A1* | 12/2021 | Yu | H01L 23/5283 |
| 2022/0069117 | A1* | 3/2022 | Yu | H10D 30/024 |
| 2022/0093448 | A1 | 3/2022 | Yu et al. | |
| 2022/0115510 | A1 | 4/2022 | Yu et al. | |
| 2022/0130991 | A1 | 4/2022 | Yu et al. | |
| 2022/0139911 | A1* | 5/2022 | Wei | H01L 23/5226 |
| | | | | 257/365 |
| 2022/0165860 | A1* | 5/2022 | Tsai | H10D 84/83 |
| 2022/0238659 | A1 | 7/2022 | Lee et al. | |
| 2022/0238660 | A1 | 7/2022 | Huang et al. | |
| 2022/0262791 | A1 | 8/2022 | Shi et al. | |
| 2022/0262794 | A1 | 8/2022 | Chiu et al. | |

* cited by examiner

150

50
41
24_2
23_2
22_2
22_2
26_3
14
12U
12
12L

25_2

25_1

24_1
23_1
22_1
22_1
26_1

26_2

62m

72

74

70

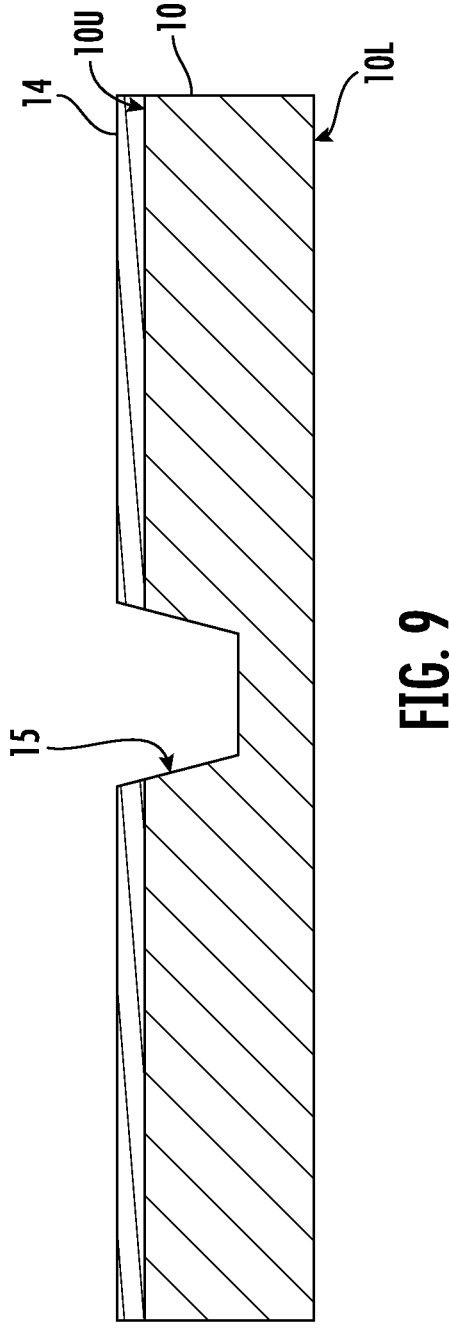
FIG. 9
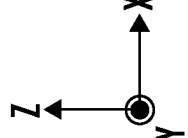

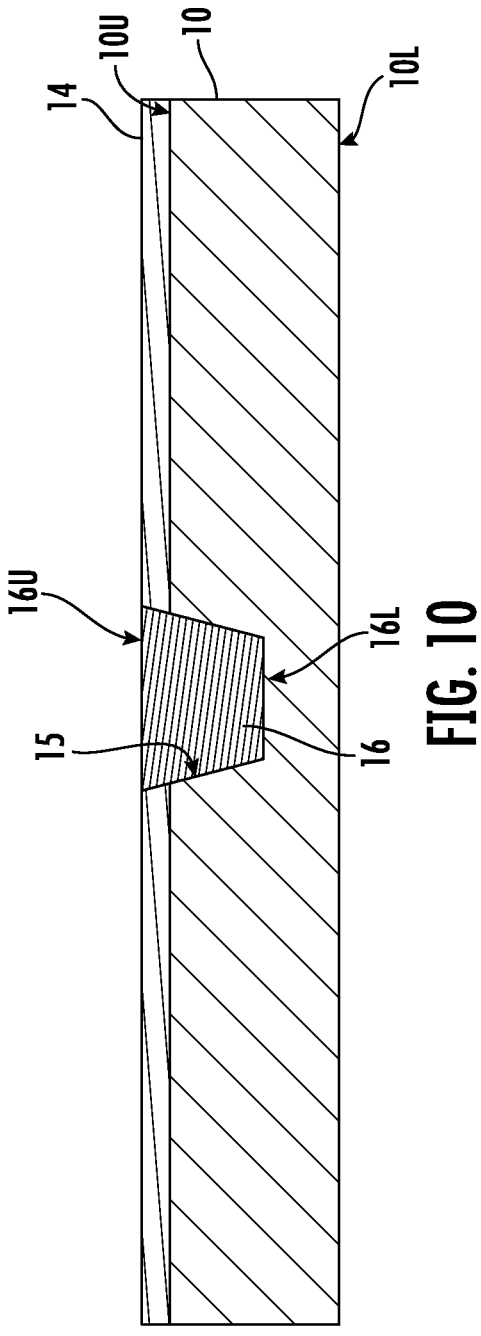
FIG. 10
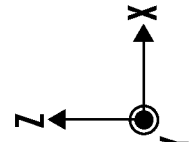

INTEGRATED CIRCUIT DEVICES INCLUDING A BACK SIDE POWER DISTRIBUTION NETWORK STRUCTURE AND METHODS OF FORMING THE SAME

CROSS-REFERENCE TO RELATED APPLICATION

This application claims priority to U.S. Provisional Application Ser. No. 63/371,928 entitled INTEGRATED CIRCUIT DEVICE INCLUDING BACKSIDE POWER DISTRIBUTION NETWORK STRUCTURE AND METHODS OF FORMING THE SAME, filed in the USPTO on Aug. 19, 2022, the disclosure of which is hereby incorporated by reference herein in its entirety.

BACKGROUND

The present disclosure generally relates to the field of integrated circuit devices and, more particularly, to integrated circuit devices including a backside power distribution network (BSPDN) structure.

Various structures of an integrated circuit device and methods of forming the same have been proposed to increase the integration density of the integrated circuit device. Specifically, an integrated circuit device including elements formed in a substrate or on a backside of the substrate has been proposed to simplify the middle-of-line (MOL) portion and/or the back-end-of-line (BEOL) portion of device fabrication.

SUMMARY

An integrated circuit devices according to some embodiments may include a transistor including a channel region and a source/drain region contacting the channel region, a power rail that is configured be electrically connected to a power source and is spaced apart from the source/drain region in a first direction, and a power contact that is between the source/drain region and the power rail and contacts both the source/drain region and the power rail. The channel region may overlap the power contact in the first direction.

An integrated circuit devices according to some embodiments may include a transistor including a channel region and a source/drain region. The source/drain region includes a side surface contacting the channel region. The integrated circuit devices may also include a power rail that is configured be electrically connected to a power source and is spaced apart from the source/drain region in a first direction and a power contact that is between the source/drain region and the power rail and contacts both the source/drain region and the power rail. A side surface of the power contact may protrude in a second direction beyond the side surface of the source/drain region, and the second direction may be perpendicular to the first direction.

A method of forming an integrated circuit devices according to some embodiments may include etching an upper surface of a substrate to form an opening in the substrate, forming a sacrificial element in the opening of the substrate, and forming a transistor including a channel region and a source/drain region contacting the channel region. An upper surface of the sacrificial element faces the source/drain region. The methods may also include removing a lower portion of the substrate to expose a lower surface of the sacrificial element, replacing the sacrificial element with a power contact, and forming a power rail that contacts a lower surface of the power contact. The source/drain region may contact an upper surface of the power contact.

BRIEF DESCRIPTION OF THE DRAWINGS

FIGS. 9 through 14 are cross-sectional views illustrating methods of forming an integrated circuit device according to some embodiments.

DETAILED DESCRIPTION

According to some embodiments, an integrated circuit device may include a power contact that may be formed by replacing a placeholder in a substrate. The placeholder may be formed before performing the front-end-of-line (FEOL) portion of device fabrication, and thus the power contact may be formed without increasing the complexity of the MEOL and/or BEOL portions of device fabrication. After the power contact is formed, a BSPDN structure may be formed on the power contact. The BSPDN structure may simplify the MOL portion and/or the BEOL portion of device fabrication.

Example embodiments will be described in greater detail with reference to the attached figures.

Figure 1:
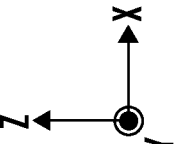
FIGS. 1-7 respectively are cross-sectional views of integrated circuit devices according to some embodiments.

FIG. 1 is a cross-sectional view of a first integrated circuit device 110 according to some embodiments. The first integrated circuit device 110 may include a first transistor and a second transistor on a substrate 12 that includes an upper surface 12U and a lower surface 12L. In some embodiments, the upper surface 12U of the substrate 12 may extend in a first direction X (also referred to as a first horizontal direction) and a second direction Y (also referred to as a second horizontal direction). The upper surface 12U of the substrate 12 may be parallel to the lower surface 12L of the substrate 12. Accordingly, the first direction X and the second direction Y may be parallel to the upper surface 12U and the lower surface 12L of the substrate 12. In some embodiments, the first direction X may be perpendicular to the second direction Y.

The substrate 12 may include semiconductor material(s), for example, Si, Ge, SiGe, GaP, GaAs, SiC, SiGeC and/or InP or may include insulating material(s), for example, silicon oxide, silicon oxynitride, silicon nitride, silicon carbonitride and/or a low-k material. In some embodiments, the substrate 12 may be a bulk substrate (e.g., a bulk silicon substrate) or a semiconductor on insulator (SOI) substrate. For example, the substrate 12 may be a silicon wafer or may be a single insulating layer. A thickness of the substrate 12 in a third direction Z (also referred to as a vertical direction) may be in a range of 50 nm to 100 nm. In some embodiments, the third direction Z may be perpendicular to the first direction X. For example, the low-k material may include fluorine-doped silicon oxide, organosilicate glass, carbon-doped oxide, porous silicon dioxide, porous organosilicate glass, spin-on organic polymeric dielectrics and/or spin-on silicon based polymeric dielectric.

The first integrated circuit device 110 may further include a first interlayer 14 that may be provided on the upper surface 12U of the substrate 12. In some embodiments, the first interlayer 14 may extend between the substrate 12 and the first and second transistors and may contact the upper surface 12U of the substrate 12 and the first and second transistors. For example, the first interlayer 14 may include insulating material(s) (e.g., silicon oxide, silicon oxynitride, silicon nitride, silicon carbonitride and/or a low-k material).

The first transistor may include a first channel region 22_1. In some embodiments, the first transistor may include multiple first channel regions 22_1 stacked in the third direction Z, and the first channel regions 22_1 may be spaced apart from each other in the third direction Z, as illustrated in FIG. 1. The first transistor may also include a first gate structure that may include a first gate insulator 23_1 and a first gate electrode 24_1. The first channel region 22_1 may extend through the first gate electrode 24_1 in the first direction X, and the first gate insulator 23_1 may be provided between the first gate electrode 24_1 and the first channel region 22_1. The first gate insulator 23_1 may contact the first gate electrode 24_1 and the first channel region 22_1.

The second transistor may include a second channel region 22_2. In some embodiments, the second transistor may include multiple second channel regions 22_2 stacked in the third direction Z, and the second channel regions 22_2 may be spaced apart from each other in the third direction Z, as illustrated in FIG. 1. The second transistor may also include a second gate structure that may include a second gate insulator 23_2 and a second gate electrode 24_2. The second channel region 22_2 may extend through the second gate electrode 24_2 in the first direction X, and the second gate insulator 23_2 may be provided between the second gate electrode 24_2 and the second channel region 22_2. The second gate insulator 23_2 may contact the second gate electrode 24_2 and the second channel region 22_2.

Further, the first transistor may include first and second source/drain regions 26_1 and 26_2 that may be spaced apart from each other in the first direction X, and the first gate structure may be provided between the first and second source/drain regions 26_1 and 26_2. The first and second source/drain regions 26_1 and 26_2 may contact opposing side surfaces of the first channel region 22_1, respectively, as illustrated in FIG. 1. The second transistor may include the second source/drain region 26_2 and a third source/drain region 26_3 that may be spaced apart from each other in the first direction X, and the second gate structure may be provided between the second and third source/drain regions 26_2 and 26_3. The second and third source/drain regions 26_2 and 26_3 may contact opposing side surfaces of the second channel region 22_2, respectively, as illustrated in FIG. 1. The second source/drain region 26_2 may also be referred to as a common source/drain region, as the second source/drain region 26_2 is shared by the first and second transistors.

Each of the first and second channel regions 22_1 and 22_2 may include semiconductor material(s) (e.g., Si, Ge, SiGe, GaP, GaAs, SiC, SiGeC and/or InP). In some embodiments, the first and second channel regions 22_1 and 22_2 may include the same material(s). In some embodiments, each of the first and second channel regions 22_1 and 22_2 may be a nanosheet that may have a thickness in a range of from 1 nm to 100 nm in the third direction Z or may be a nanowire that may have a circular cross-section with a diameter in a range of from 1 nm to 100 nm.

Each of the first and second gate insulators 23_1 and 23_2 may include a single layer or multiple layers (e.g., a silicon oxide layer and/or a high-k material layer). For example, the high-k material layer may include $Al_2O_3$, $HfO_2$, $ZrO_2$, $HfZrO_4$, $TiO_2$, $Sc_2O_3 Y_2O_3$, $La_2O_3$, $Lu_2O_3$, $Nb_2O_5$ and/or $Ta_2O_5$. In some embodiments, each of the first and second gate insulators 23_1 and 23_2 may include the same material(s).

Each of the first and second gate electrodes 24_1 and 24_2 may include a single layer or multiple layers. In some embodiments, each of the first and second gate electrodes 24_1 and 24_2 may include a metallic layer that includes, for example, tungsten (W), aluminum (Al), copper (Cu), molybdenum (Mo) and/or ruthenium (Ru) and may additionally include work function layer(s) (e.g., a TiN layer, a TaN layer, a TiAl layer, a TiC layer, a TiAlC layer, a TiAlN layer and/or a WN layer). In some embodiments, the first and second gate electrodes 24_1 and 24_2 may include the same material(s). The work function layer(s) may be provided between the metallic layer and the gate insulator (i.e., one of the first and second gate insulators 23_1 and 23_2). In some embodiments, the work function layer(s) may separate the metallic layer from the gate insulator.

Each of the first, second and third source/drain regions 26_1, 26_2 and 26_3 may include a semiconductor layer (e.g., a silicon layer and/or a silicon germanium layer) and may additionally include dopants in the semiconductor layer. In some embodiments, each of the first, second and third source/drain regions 26_1, 26_2 and 26_3 may include a metal layer that includes, for example, W, Al, Cu, Mo and/or Ru.

The first and second transistors may also respectively include first and second insulating spacers 25_1 and 25_2 (also referred to as a gate spacer or an inner gate spacer). The first insulating spacer 25_1 may be provided between the first gate electrode 24_1 and the first and second source/drain regions 26_1 and 26_2 and/or may be provided between the first gate electrode 24_1 and the first interlayer 14. In some embodiments, opposing surfaces of the first insulating spacer 25_1 may respectively contact the first gate electrode 24_1 and one of the first and second source/drain regions 26_1 and 26_2 and may respectively contact the first gate electrode 24_1 and the first interlayer 14, as illustrated in FIG. 1. The first channel region 22_1 may extend through the first insulating spacer 25_1 in the first direction X, as illustrated in FIG. 1.

The second insulating spacer 25_2 may be provided between the second gate electrode 24_2 and the second and third source/drain regions 26_2 and 26_3 and/or may be provided between the second gate electrode 24_2 and the first interlayer 14. In some embodiments, opposing surfaces of the second insulating spacer 25_2 may respectively contact the second gate electrode 24_2 and one of the second and third source/drain regions 26_2 and 26_3 and may respectively contact the second gate electrode 24_2 and the first interlayer 14, as illustrated in FIG. 1. The second channel region 22_2 may extend through the second insulating spacer 25_2 in the first direction X, as illustrated in FIG. 1. Each of the first and second insulating spacers 25_1 and 25_2 may include, for example, silicon oxide, silicon oxynitride, silicon nitride, silicon carbonitride and/or a low-k material.

A second interlayer 41 may be provided on the first interlayer 14, and the first and second transistors may be provided in the second interlayer 41. Although FIG. 1 illustrates the second interlayer 41 as a single layer, in some embodiments, the second interlayer 41 may include multiple layers.

A source/drain contact 42 may be provided in the second interlayer 41 on the first source/drain region 26_1. The source/drain contact 42 may contact an upper surface of the first source/drain region 26_1. The source/drain contact 42 may electrically connect the first source/drain region 26_1 to a conductive element (e.g., a conductive wire or a conductive via plug) of a BEOL structure 50 that is formed through the BEOL portion of device fabrication. As used herein, "a lower surface" refers to a surface facing the substrate 12, and "an upper surface" refers to a surface opposite the lower surface. Further, as used herein, "a lower portion" refers to a portion that is closer than "an upper portion" to the substrate 12 and thus is between the upper portion and the substrate 12.

The BEOL structure 50 may include a BEOL insulating layer, conductive wires (e.g., metal wires) that are provided in the BEOL insulating layer and are stacked in the third direction Z, and conductive via plugs (e.g., metal via plugs), each of which may electrically connect two conductive wires that are spaced apart from each other in the third direction Z.

Each of the first and second interlayers 14 and 41 and the BEOL insulating layer may include, for example, silicon oxide, silicon oxynitride, silicon nitride, silicon carbonitride and/or a low-k material.

The first integrated circuit device 110 may further include a power contact 62 and a BSPDN structure 70. The power contact 62 may include an upper portion in the first interlayer 14 and a lower portion in the substrate 12. In some embodiments, the power contact 62 may extend through the first interlayer 14 and the substrate 12 in the third direction Z, and the power contact 62 (e.g., an upper surface of the power contact 62) may contact the second source/drain region 26_2 (e.g., a lower surface of the second source/drain region 26_2), as illustrated in FIG. 1. Further, the power contact 62 (e.g., the upper surface of the power contact 62) may contact the first and second insulating spacers 25_1 and 25_2, as illustrated in FIG. 1. In some embodiments, the power contact 62 may contact only one of the first and second insulating spacers 25_1 and 25_2.

Referring to FIG. 1, the power contact 62 includes a first portion that the first channel region 22_1 overlaps in the third direction Z and a second portion that the second channel region 22_2 overlaps in the third direction Z. In some embodiments, the power contact 62 may include only one of the first and second portions. Further, each of the first and second gate electrodes 24_1 and 24_2 may overlap a portion of the power contact 62 in the third direction Z. As used herein, "an element A overlapping an element B in a direction X" (or similar language) means that there is at least one line that extends in the direction X and intersects both the elements A and B.

The upper surface of the power contact 62 may have a width in the first direction X, which is wider than a width of the lower surface of the second source/drain region 26_2 in the first direction X, as illustrated in FIG. 1. A side surface 62ss of the power contact 62 may protrude in the first direction X beyond a side surface 26_2ss of the second source/drain region 26_2, as illustrated in FIG. 1.

In some embodiments, a width of the power contact 62 in the first direction X may decrease with increasing distance from the second source/drain region 26_2 in the third direction Z, as illustrated in FIG. 1. In some embodiments, a width of the power contact 62 in the second direction Y may also decrease with increasing distance from the second source/drain region 26_2 in the third direction Z.

The power contact 62 may electrically connect the second source/drain region 26_2 to a conductive element (e.g., a conductive wire or a conductive via plug) of the BSPDN structure 70. The BSPDN structure 70 may include, for example, a power rail 72 and a backside insulator 74 in which the power rail 72 is provided. The power rail 72 may be electrically connected to a power source with a predetermined voltage (e.g., a drain voltage or a source voltage), and thus the second source/drain region 26_2 may be electrically connected to the power source through the power contact 62 and the power rail 72. In some embodiments, the power contact 62 may contact both the second source/drain region 26_2 and the power rail 72. Although the backside insulator 74 is illustrated as a single layer, in some embodiments, the backside insulator 74 may include multiple layers stacked on the lower surface 12L of the substrate 12. Further, although the BSPDN structure 70 is illustrated as contacting the lower surface 12L of the substrate 12, in some embodiments, an intervening structure may be provided between the substrate 12 and the BSPDN structure 70 and may separate the substrate 12 from the BSPDN structure 70. Each of the power contact 62 and the power rail 72 may include, for example, metal element(s) (e.g., W, Al, Cu, Mo and/or Ru), and the backside insulator 74 may include, for example, silicon oxide, silicon oxynitride, silicon nitride, silicon carbonitride and/or a low-k material.

Figure 2:
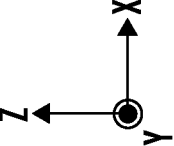

FIG. 2 is a cross-sectional view of a second integrated circuit device 120 according to some embodiments. The second integrated circuit device 120 is similar to the first integrated circuit device 110. The second integrated circuit device 120 may be different from the first integrated circuit device 110, in that the second source/drain region 26_2 may have a first center 26_2c in the first direction X, and the first center 26_2c may be offset from a center 62c of a power contact 62o in the first direction X, as illustrated in FIG. 2. In some embodiments, the second channel region 22_2 and a portion of the second source/drain region 26_2 may not overlap the power contact 62o in the third direction Z, as illustrated in FIG. 2 but, in some other embodiments, the second channel region 22_2 and an entirety of the second source/drain region 26_2 may overlap the power contact 62o. As used herein, "a center" may be interchangeable with "a center point."

Figure 3:
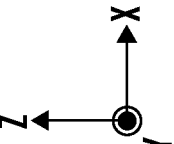

FIG. 3 is a cross-sectional view of a third integrated circuit device 130 according to some embodiments. The third integrated circuit device 130 is similar to the first integrated circuit device 110. The third integrated circuit device 130 may differ from the first integrated circuit device 110, in that the third integrated circuit device 130 includes a power contact 62n that has an upper surface having a width in the first direction X, and that width of the power contact 62n is narrower than a width of the lower surface of the second source/drain region 26_2 in first direction X. In some embodiments, opposing edge portions of the second source/drain region 26_2 may not overlap the power contact 62n in the third direction Z. The power contact 62n may have a second center 62nc in the first direction X, and the first center 26_2c of the second source/drain region 26_2 may be aligned with the second center 62nc of the power contact 62n in the third direction Z, as illustrated in FIG. 3. In other embodiments, the first center 26_2c and the second center 62nc may be offset in the first direction X.

Figure 4:
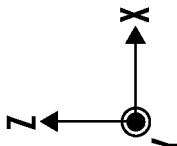

FIG. 4 is a cross-sectional view of a fourth integrated circuit device 140 according to some embodiments. The fourth integrated circuit device 140 is similar to the first integrated circuit device 110. The fourth integrated circuit device 140 may differ from the first integrated circuit device 110, in that the fourth integrated circuit device 140 includes a power contact 62a including an upper surface that has a width in the first direction X, and that width of the power contact 62a is the same as the width of the lower surface of the second source/drain region 26_2 in the first direction X.

Figure 5:
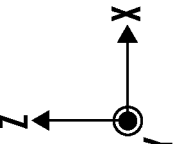

FIG. 5 is a cross-sectional view of a fifth integrated circuit device 150 according to some embodiments. The fifth integrated circuit device 150 is similar to the first integrated circuit device 110. The fifth integrated circuit device 150 may differ from the first integrated circuit device 110, in that the fifth integrated circuit device 150 includes a power contact 62*m* contacting both the first and second source/drain regions 26_1 and 26_2 (e.g., lower surfaces of the first and second source/drain regions 26_1 and 26_2), and a source/drain contact (e.g., the source/drain contact 42 in FIG. 1) may be omitted. In some embodiments, the first transistor including the first and second source/drain regions 26_1 and 26_2 may be a dummy transistor that does not function as a transistor. In some embodiments, the first gate electrode 24_1 may not be electrically connected to any conductive element when the first transistor is a dummy transistor.

Figure 6:
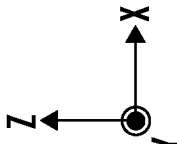

FIG. 6 is a cross-sectional view of a sixth integrated circuit device 160 according to some embodiments. The sixth integrated circuit device 160 is similar to the first integrated circuit device 110. The sixth integrated circuit device 160 may differ from the first integrated circuit device 110, in that each of the first and second transistors includes a single channel region (e.g., a first channel region 22_1' or a second channel region 22_2'). The single channel region may be referred to as a fin-shaped channel region, and each of the first and second transistors may be referred to as a fin field-effect transistor (FinFET).

It will be understood that the first to fifth integrated circuit devices 110, 120, 130, 140 and 150 may include the first and second transistors, each of which includes a single fin-shaped channel region and is a FinFET.

Figure 7:
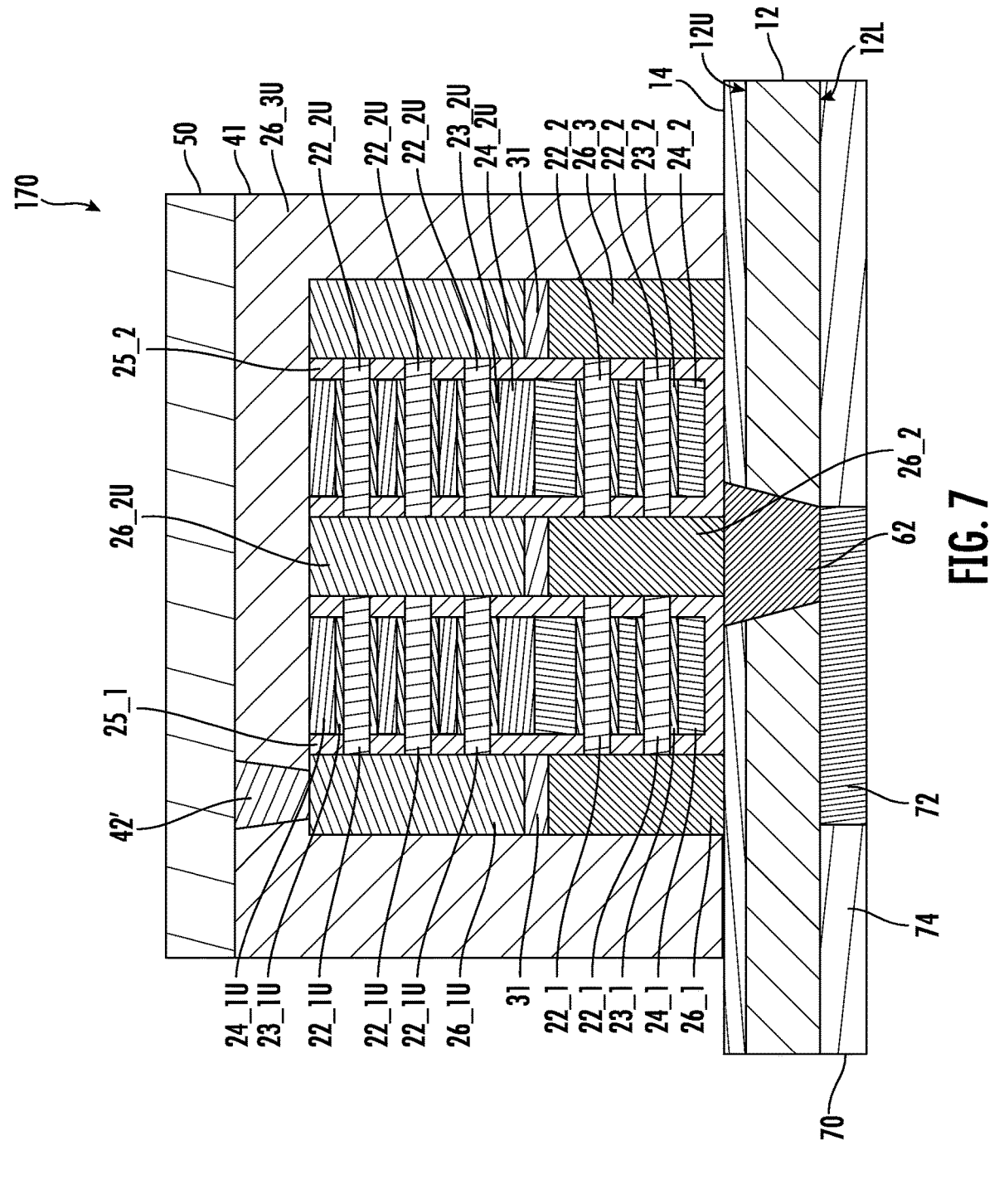

FIG. 7 is a cross-sectional view of a seventh integrated circuit device 170 according to some embodiments. The seventh integrated circuit device 170 is similar to the first integrated circuit device 110. The seventh integrated circuit device 170 may differ from the first integrated circuit device 110, in that the seventh integrated circuit device 170 further includes a first upper transistor and a second upper transistor.

The first upper transistor may be provided on the first transistor, and thus the first transistor may be between substrate 12 and the first upper transistor. The first upper transistor may include a first upper channel region 22_1U. In some embodiments, the first upper transistor may include multiple first upper channel regions 22_1U stacked in the third direction Z, and the first upper channel regions 22_1U may be spaced apart from each other in the third direction Z, as illustrated in FIG. 7. The first transistor may also include a first upper gate structure that may include a first upper gate insulator 23_1U and a first upper gate electrode 24_1U. The first upper channel region 22_1U may extend through the first upper gate electrode 24_1U in the first direction X, and the first upper gate insulator 23_1U may be provided between the first upper gate electrode 24_1U and the first upper channel region 22_1U. The first upper gate insulator 23_1U may contact first upper gate electrode 24_1U and the first upper channel region 22_1U.

The second upper transistor may be provided on the second transistor, and thus the second transistor may be between the substrate 12 and the second upper transistor. The second upper transistor may include a second upper channel region 22_2U. In some embodiments, the upper second transistor may include multiple second upper channel regions 22_2U stacked in the third direction Z, and the second upper channel regions 22_2U may be spaced apart from each other in the third direction Z, as illustrated in FIG. 7. The second upper transistor may also include a second upper gate structure that may include a second upper gate insulator 23_2U and a second upper gate electrode 24_2U. The second upper channel region 22_2U may extend through the second upper gate electrode 24_2U in the first direction X, and the second upper gate insulator 23_2U may be provided between the second upper gate electrode 24_2U and the second upper channel region 22_2U. The second upper gate insulator 23_2U may contact the second upper gate electrode 24_2U and the second upper channel region 22_2U.

Further, the first upper transistor may include first and second upper source/drain regions 26_1U and 26_2U that may be spaced apart from each other in the first direction X, and the first upper gate structure may be provided between the first and second upper source/drain regions 26_1U and 26_2U. The first and second upper source/drain regions 26_1U and 26_2U may contact opposing side surfaces of the first upper channel region 22_1U, respectively, as illustrated in FIG. 7. The second upper transistor may include the second upper source/drain region 26_2U and a third upper source/drain region 26_3U that may be spaced apart from each other in the first direction X, and the second upper gate structure may be provided between the second and third upper source/drain regions 26_2U and 26_3U. The second and third upper source/drain regions 26_2U and 26_3U may contact opposing side surfaces of the second upper channel region 22_2U, respectively, as illustrated in FIG. 7. The second upper source/drain region 26_2U may also be referred to as a common upper source/drain region, as the second upper source/drain region 26_2U is shared by the first and second upper transistors.

The seventh integrated circuit device 170 may also include a third interlayer 31 that is provided between the first transistor and the first upper transistor and between the second transistor and the second upper transistor. In some embodiments, the third interlayer 31 may be between and may contact the first source/drain region 26_1 and the first upper source/drain region 26_1U, may be between and may contact the second source/drain region 26_2 and the second upper source/drain region 26_2U, and may be between and may contact the third source/drain region 26_3 and the third upper source/drain region 26_3U, as illustrated in FIG. 7. For example, the third interlayer 31 may include, for example, silicon oxide, silicon oxynitride, silicon nitride, silicon carbonitride and/or a low-k material. A source/drain contact 42' may be provided on the first upper source/drain region 26_1U and may contact an upper surface of the first upper source/drain region 26_1U.

In some embodiments, the first transistor and the first upper transistor may have different conductivity types and may collectively form a first complementary metal-oxide-semiconductor (CMOS) structure, and the second transistor and the second upper transistor may have different conductivity types and may collectively form a second CMOS structure.

In some embodiments, each of the first transistor, the first upper transistor, the second transistor and the second upper transistor may include a single fin-shaped channel region and may be a FinFET.

Each of the elements of the first and second upper transistors may include material(s) the same as the material(s) of a corresponding element of the first and second transistors. For example, the first upper source/drain region 26_1U may include material(s) the same as the material(s) of the first source/drain region 26_1, and the second upper gate electrode 24_2U may include material(s) the same as the material(s) of the second gate electrode 24_2.

Figure 8:
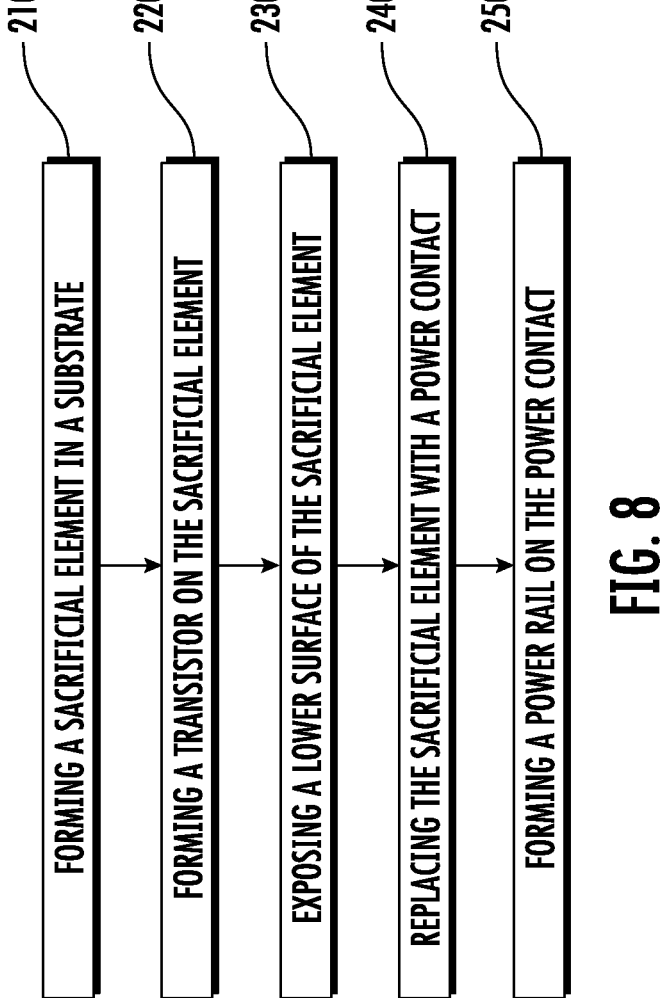
FIG. 8 is a flow chart of methods of forming an integrated circuit device according to some embodiments.

FIG. 8 is a flow chart of methods of forming the first integrated circuit device 110 according to some embodiments, and FIGS. 9 through 14 are cross-sectional views illustrating those methods according to some embodiments.

Referring to FIGS. 8, 9 and 10, the methods may include etching an upper surface 10U of a preliminary substrate 10 (also referred to as a substrate) to form an opening 15 in the preliminary substrate 10 and then forming a placeholder 16 (e.g., a sacrificial layer) in the opening 15 of the preliminary substrate 10 (Block 210). In some embodiments, a first interlayer 14 may be formed on the upper surface 10U of the preliminary substrate 10 before forming the opening 15, and the opening 15 may be formed in the first interlayer 14 and the preliminary substrate 10. The opening 15 may not extend completely through the preliminary substrate 10 in the third direction Z.

The preliminary substrate 10 may include one or more semiconductor materials, for example, Si, Ge, SiGe, GaP, GaAs, SiC, SiGeC and/or InP or may include insulating material, for example, silicon oxide, silicon oxynitride, silicon nitride, silicon carbonitride and/or a low-k material. In some embodiments, the preliminary substrate 10 may be a bulk substrate (e.g., a bulk silicon substrate) or a semiconductor on insulator (SOI) substrate. For example, the preliminary substrate 10 may be a silicon wafer or may be an insulating layer.

The placeholder 16 may have a width in the first direction X decreasing in a depth direction of the opening 15, as illustrated in FIG. 10. An upper surface 16U of the placeholder 16 may be coplanar with an upper surface of the first interlayer 14. A lower surface 16L of the placeholder 16 may be in the preliminary substrate 10. The placeholder 16 may include, for example, a semiconductor material and/or an insulating material (e.g., SiGe, SiN or SiBCN). In some embodiments, the placeholder 16 may include a SiGe layer including about 25 at % of germanium (e.g., from 15 at % to 25 at %). When a source/drain region (e.g., the first source/drain region 26_1 or the second source/drain region 26_2 in FIG. 1) includes a SiGe layer, a germanium concentration of the source/drain region may be higher than the germanium concentration of the SiGe layer of the placeholder 16. For example, the germanium concentration of the source/drain region may be about 55 at % (e.g., from 40 at % to 70 at %).

Figure 11:
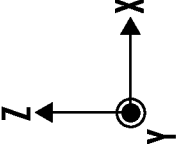

Referring to FIGS. 8 and 11, a transistor (e.g., the first transistor or the second transistor discussed with reference to FIG. 1) may be formed on the placeholder 16 (Block 220). A second source/drain region 26_2 (e.g., a lower surface of the second source/drain region 26_2) may contact the placeholder 16 (e.g., the upper surface of the placeholder 16). A second interlayer 41 may be formed on the transistor and a source/drain contact 42 may be formed on a first source/drain region 26_1. A BEOL structure 50 may be formed on the second interlayer 41.

Figure 12:
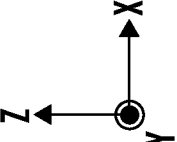

Referring to FIG. 12, the preliminary substrate 10 may be removed by performing process(es) (e.g., a grinding process, a wet etching process, a dry etching process and/or a Chemical Mechanical Polishing (CMP) process) on a preliminary lower surface 10L of the preliminary substrate 10, and a lower portion, including the lower surface 16L, of the placeholder 16 may be exposed (Block 230). The preliminary substrate 10 may be selectively removed such that the placeholder 16 and the first interlayer 14 may not be removed.

Figure 13:
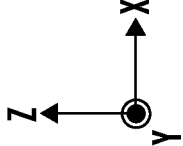

Referring to FIG. 13, a substrate 12 may be formed on the placeholder 16 and the first interlayer 14. The placeholder 16 may be provided in the substrate 12 and may contact the substrate 12. The lower surface 16L of the placeholder 16 may be coplanar with the lower surface 12L of the substrate 12.

Figure 14:
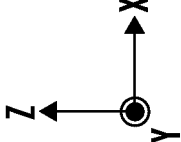

Referring to FIGS. 8 and 14, the placeholder 16 may be replaced with a power contact 62 (Block 240). The power contact 62 may have a lower surface 62L that is coplanar with the lower surface 12L of the substrate 12.

Referring to FIGS. 1 and 8, a power rail 72 of a BSPDN structure 70 may be formed (Block 250) on the power contact 62 and on the lower surface 12L of the substrate 12. The power rail 72 may contact the lower surface 62L of the power contact 62.

It will be understood that the second, third, fourth, fifth, sixth and seventh integrated circuit devices 120, 130, 140, 150, 160 and 170 can be formed by methods similar to those described with reference to FIGS. 9-15 with appropriate modification thereto.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
a transistor comprising a channel region and a source/drain region contacting the channel region;
a power rail that is configured be electrically connected to a power source and is spaced apart from the source/drain region in a first direction; and
a power contact that is between the source/drain region and the power rail and contacts both the source/drain region and the power rail,
wherein the channel region overlaps the power contact in the first direction, and
wherein the source/drain region has a first center point in a second direction that is perpendicular to the first direction, the power contact has a second center point in the second direction, and the first center point is offset from the second center point in the second direction,
wherein the source/drain region comprises a portion that does not overlap the power contact in the first direction.

2. The integrated circuit device of claim 1, further comprising a back-end-of-line (BEOL) structure including a conductive wire on the transistor,
wherein the transistor is between the BEOL structure and the power rail.

3. The integrated circuit device of claim 1, wherein a lower surface of the source/drain region contacts an upper surface of the power contact, and
the lower surface of the source/drain region has a first width in the second direction, the upper surface of the power contact has a second width in the second direction, and the second width is wider than the first width.

4. The integrated circuit device of claim 1, wherein a width of the power contact in a second direction that is perpendicular to the first direction continuously decreases as a distance from the source/drain region increases.

5. The integrated circuit device of claim 1, wherein the channel region comprises a first side surface and a second side surface that is opposite the first side surface and is spaced apart from the first side surface in a second direction that is perpendicular to the first direction,
the source/drain region is a first source/drain region contacting the first side surface of the channel region,
the integrated circuit device further comprises a second source/drain region contacting the second side surface of the channel region,
each of the first and second source/drain regions comprises a lower surface and an upper surface,
the power contact contacts the lower surface of the first source/drain region, and
the integrated circuit device further comprises a source/drain contact contacting the upper surface of the second source/drain region.

6. The integrated circuit device of claim 1, wherein the source/drain region comprises a side surface contacting the channel region, and
a side surface of the power contact protrudes in a second direction beyond the side surface of the source/drain region, and the second direction is perpendicular to the first direction.

7. The integrated circuit device of claim 1, wherein the transistor further comprises a gate structure, and a portion of the channel region is in the gate structure, and
wherein the gate structure overlaps the power contact in the first direction.

8. An integrated circuit device comprising:
a transistor comprising a channel region and a source/drain region contacting the channel region;
a power rail that is configured be electrically connected to a power source and is spaced apart from the source/drain region in a first direction; and
a power contact that is between the source/drain region and the power rail and contacts both the source/drain region and the power rail,
wherein the channel region overlaps the power contact in the first direction,
wherein the channel region comprises a first side surface and a second side surface that is opposite the first side surface and is spaced apart from the first side surface in a second direction that is perpendicular to the first direction,
the source/drain region is a first source/drain region contacting the first side surface of the channel region,
the integrated circuit device further comprises a second source/drain region contacting the second side surface of the channel region, and both the first source/drain region and the second source/
drain region contact the power contact.

9. An integrated circuit device comprising:
a transistor comprising a channel region and a source/
drain region, wherein the source/drain region com-
prises a side surface contacting the channel region;
a power rail that is configured be electrically connected to
a power source and is spaced apart from the source/
drain region in a first direction; and
a power contact that is between the source/drain region
and the power rail and contacts both the source/drain
region and the power rail,
wherein a side surface of the power contact protrudes in
a second direction beyond the side surface of the
source/drain region, and the second direction is per-
pendicular to the first direction,
wherein the source/drain region has a first center point in
the second direction, the power contact has a second
center point in the second direction, and the first center
point is offset from the second center point in the
second direction,
wherein the source/drain region comprises a portion that
does not overlap the power contact in the first direction.

10. The integrated circuit device of claim 9, further
comprising a back-end-of-line (BEOL) structure including a
conductive wire on the transistor,
wherein the transistor is between the BEOL structure and
the power rail.

11. The integrated circuit device of claim 9, wherein a
lower surface of the source/drain region contacts an upper
surface of the power contact, and
the lower surface of the source/drain region has a first
width in the second direction, the upper surface of the
power contact has a second width in the second direc-
tion, and the second width is wider than the first width.

12. The integrated circuit device of claim 9, wherein a
width of the power contact in the second direction decreases
as a distance from the source/drain region increases.

13. The integrated circuit device of claim 9, wherein the
channel region comprises a first side surface and a second
side surface that is opposite the first side surface and is
spaced apart from the first side surface in the second
direction,
the source/drain region is a first source/drain region
contacting the first side surface of the channel region,
the integrated circuit device further comprises a second
source/drain region contacting the second side surface
of the channel region,
each of the first and second source/drain regions com-
prises a lower surface and an upper surface,
the power contact contacts the lower surface of the first
source/drain region, and
the integrated circuit device further comprises a source/
drain contact contacting the upper surface of the second
source/drain region.

* * * * *